United States Patent
Ikakura et al.

(10) Patent No.: US 10,998,370 B2
(45) Date of Patent: May 4, 2021

(54) SEMICONDUCTOR DEVICE WITH INSULATING LAYERS FORMING A BONDING PLANE BETWEEN FIRST AND SECOND CIRCUIT COMPONENTS, METHOD OF MANUFACTURING THE SAME, AND ELECTRONIC DEVICE

(71) Applicant: CANON KABUSHIKI KAISHA, Tokyo (JP)

(72) Inventors: Hiroshi Ikakura, Kawasaki (JP); Takumi Ogino, Koganei (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/558,863

(22) Filed: Sep. 3, 2019

(65) Prior Publication Data

US 2020/0091218 A1 Mar. 19, 2020

(30) Foreign Application Priority Data

Sep. 13, 2018 (JP) .............................. JP2018-171676

(51) Int. Cl.
*H01L 23/34* (2006.01)
*H01L 23/48* (2006.01)
(Continued)

(52) U.S. Cl.
CPC .. *H01L 27/14636* (2013.01); *H01L 21/02367* (2013.01); *H01L 21/02436* (2013.01); *H01L 23/3735* (2013.01); *H01L 23/5329* (2013.01); *H01L 23/5383* (2013.01); *H01L 25/0657* (2013.01); *H01L 27/148* (2013.01); *H01L 27/1469* (2013.01); *H01L 27/14634* (2013.01)

(58) Field of Classification Search
CPC ............. H01L 23/3735; H01L 51/0024; H01L 51/0096; H01L 21/02367; H01L 21/02436; H01L 23/5385; H01L 23/3253; H01L 23/5383; H01L 27/14636; H01L 23/5329; H01L 27/14634; H01L 27/1469; H01L 27/148
See application file for complete search history.

(56) References Cited

U.S. PATENT DOCUMENTS 9,679,937 B2 * 6/2017 Okuyama ............... H01L 24/94
9,941,323 B2 * 4/2018 Okuyama ......... H01L 23/53238
(Continued)

FOREIGN PATENT DOCUMENTS

| JP | 2016-32045 A | 3/2016 |
| WO | 2016/152513 A1 | 9/2016 |

*Primary Examiner* — Alonzo Chambliss
(74) *Attorney, Agent, or Firm* — Venable LLP

(57) ABSTRACT

A semiconductor device comprising a first circuit component and a second circuit component, the first circuit component having a first wiring structure formed by stacking one or more wiring layers and one or more insulating layers on a first semiconductor substrate, the second circuit component having a second wiring structure formed by stacking one or more wiring layers and one or more insulating layers on a second semiconductor substrate, the first and second wiring structures being bonded to each other, their bonding planes being composed of oxygen atoms and carbon atoms and/or nitrogen atoms bonded to silicon atoms, and, numbers of their atoms satisfying a predetermined equation.

14 Claims, 8 Drawing Sheets

(51) Int. Cl.
*H01L 21/00* (2006.01)
*H01L 27/146* (2006.01)
*H01L 23/532* (2006.01)
*H01L 27/148* (2006.01)
*H01L 23/538* (2006.01)
*H01L 21/02* (2006.01)
*H01L 23/373* (2006.01)
*H01L 25/065* (2006.01)

(56) References Cited

U.S. PATENT DOCUMENTS

| | | |
|---|---|---|
| 10,541,265 B2 * | 1/2020 | Okuyama ............... H01L 24/06 |
| 2009/0050941 A1 | 2/2009 | Yamazaki et al. |
| 2012/0241961 A1 | 9/2012 | Kagawa et al. |
| 2012/0248544 A1 | 10/2012 | Yokoyama |
| 2013/0009321 A1 | 1/2013 | Kagawa et al. |
| 2013/0140699 A1 * | 6/2013 | Okuyama ......... H01L 23/53238 257/751 |
| 2014/0239499 A1 * | 8/2014 | Okuyama ......... H01L 23/53238 257/741 |
| 2015/0287757 A1 * | 10/2015 | Tsai ...................... H01L 27/281 257/459 |
| 2016/0233264 A1 | 8/2016 | Kagawa et al. |

* cited by examiner

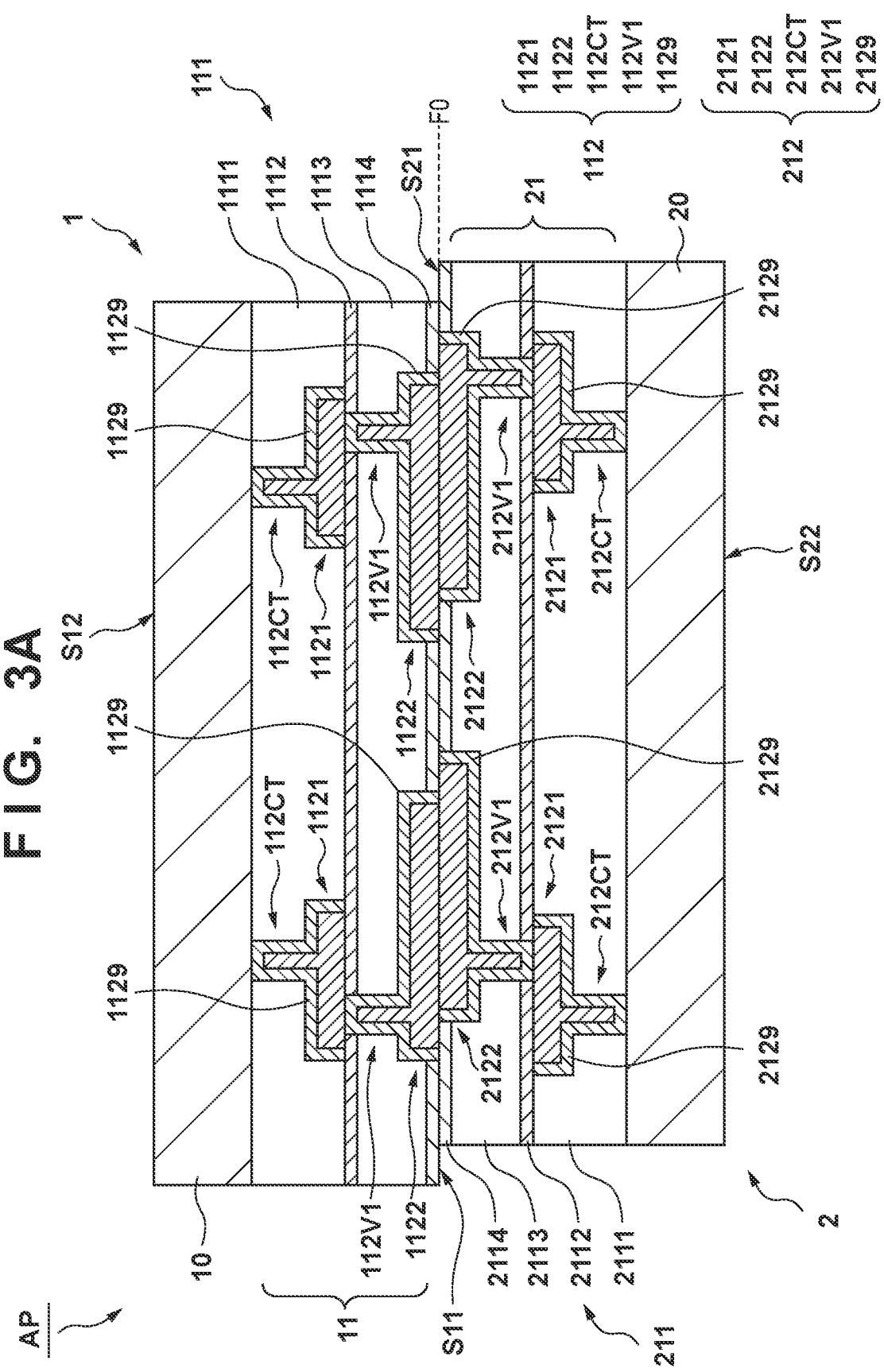

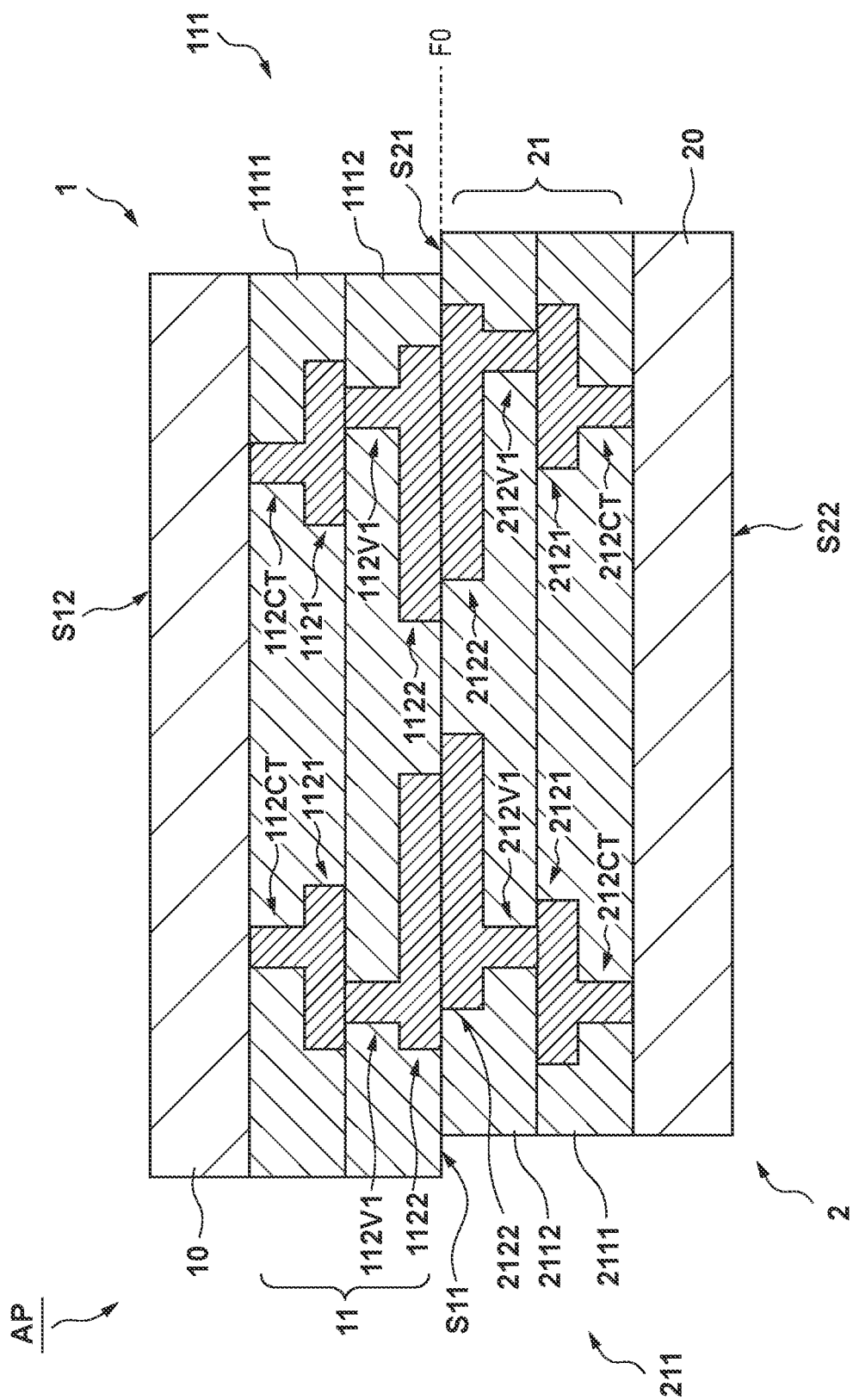

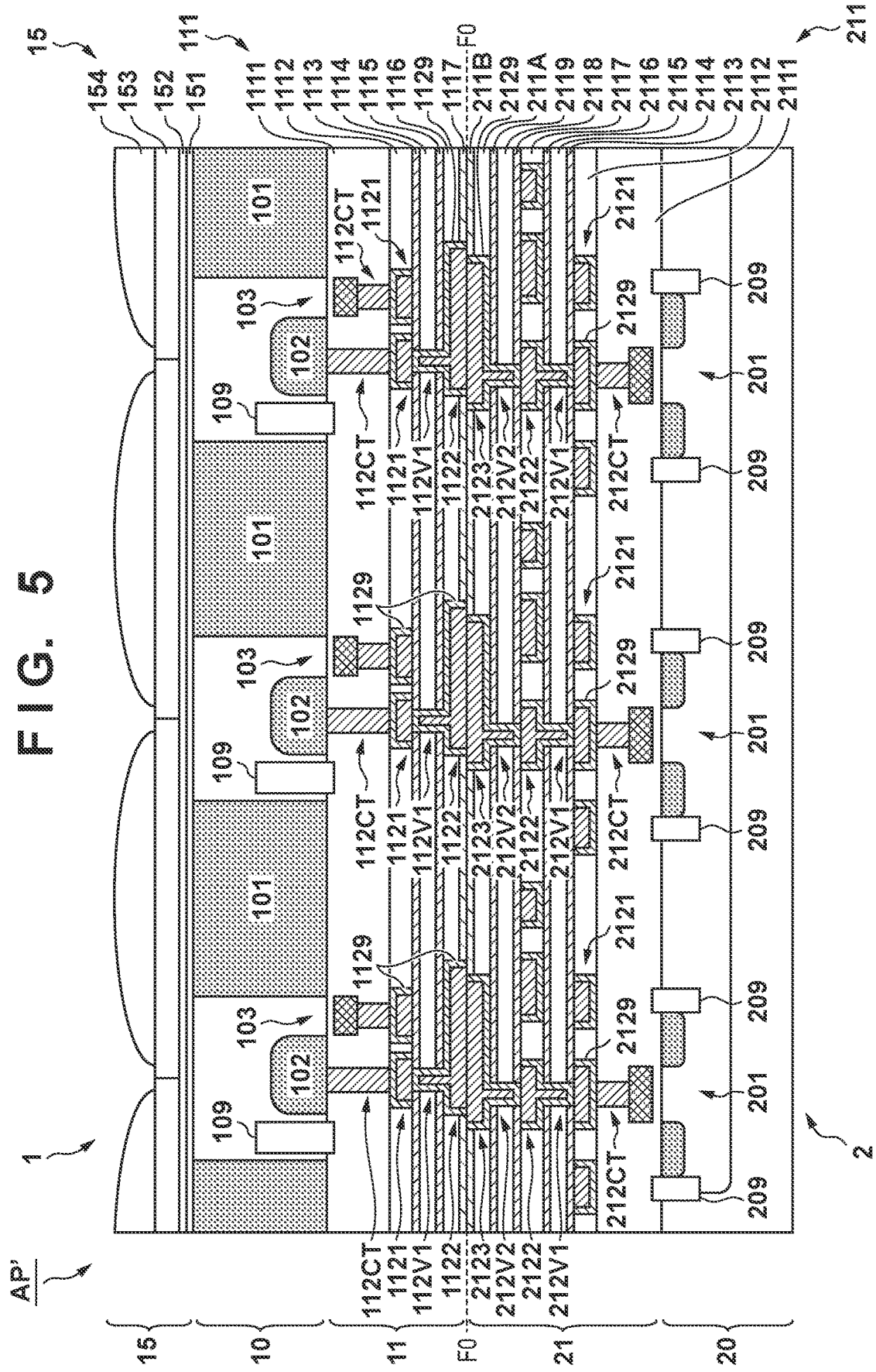

SEMICONDUCTOR DEVICE WITH INSULATING LAYERS FORMING A BONDING PLANE BETWEEN FIRST AND SECOND CIRCUIT COMPONENTS, METHOD OF MANUFACTURING THE SAME, AND ELECTRONIC DEVICE

BACKGROUND OF THE INVENTION

Field of the Invention

The present invention relates to a semiconductor device, a method of manufacturing the same, and an electronic device.

Description of the Related Art

Some semiconductor devices are configured by bonding two circuit components (refer to Japanese Patent Laid-Open No. 2016-32045). These two circuit components are each formed by providing a wiring structure on a semiconductor substrate, and these wiring structures are bonded by surface contact and electrical connection. This bonding can be realized by performing predetermined surface activation treatment on the bonding surfaces of the two circuit components, respectively, and then adhering the two circuit components together at the bonding surfaces and performing heat treatment.

Japanese Patent Laid-Open No. 2016-32045 describes the use of a diffusion preventing film for preventing metal diffusion, as a layer that forms the above-mentioned bonding surface in a wiring structure. As the diffusion preventing film, silicon nitride, silicon oxycarbide, or silicon oxycarbonitride is used. By such a structure, metal diffusion from a wiring layer to an insulating layer is prevented, and the reliability of the device is improved.

Meanwhile, in order to further strengthen the bonding of the two circuit components, it is required that bonding between silicon atoms and oxygen atoms (O—Si—O bonding) at the bonding surfaces thereof be appropriately realized. Therefore, in the above-mentioned structure of Japanese Patent Laid-Open No. 2016-32045, there is room for improvement in increasing the bonding strength at the bonding surface and further increasing the reliability of the device.

SUMMARY OF THE INVENTION

The present invention provides an advantageous technique for increasing the bonding strength of a structure of a semiconductor device in which two circuit components are bonded, and further increasing the reliability of the device.

One of the aspects of the present invention provides a semiconductor device comprising a first circuit component and a second circuit component, wherein the first circuit component has a first semiconductor substrate and a first wiring structure formed by stacking one or more wiring layers and one or more insulating layers on the first semiconductor substrate, the second circuit component has a second semiconductor substrate and a second wiring structure formed by stacking one or more wiring layers and one or more insulating layers on the second semiconductor substrate, the first wiring structure and the second wiring structure of the first circuit component and the second circuit component are bonded to each other, the insulating layers of the first wiring structure and the second wiring structure forming a bonding plane between the first circuit component and the second circuit component are both composed of oxygen atoms and carbon atoms and/or nitrogen atoms bonded to silicon atoms, and, letting the numbers of oxygen atoms, carbon atoms, and nitrogen atoms in at least the insulating layers be $N_O$, $N_C$, and $N_N$, respectively, $6 \times N_O > 3 \times N_C + 4 \times N_N$ holds.

Further features of the present invention will become apparent from the following description of exemplary embodiments with reference to the attached drawings.

BRIEF DESCRIPTION OF THE DRAWINGS

FIG. 3A is a schematic diagram for describing another example of a structure of the semiconductor device.

FIG. 4 is a schematic diagram for describing another example of a structure of the semiconductor device.

FIG. 5 is a schematic diagram for describing an example of a structure of a solid-state imaging device according to an embodiment.

DESCRIPTION OF THE EMBODIMENTS

Hereinafter, suitable embodiments of the present invention will be described with reference to the accompanying figures. It should be noted that the figures are only for the purpose of illustrating structure or configuration, and the dimensions of the components illustrated in the figures do not necessarily reflect actual dimensions.

[Configuration Example of Semiconductor Device]

Figure 1:
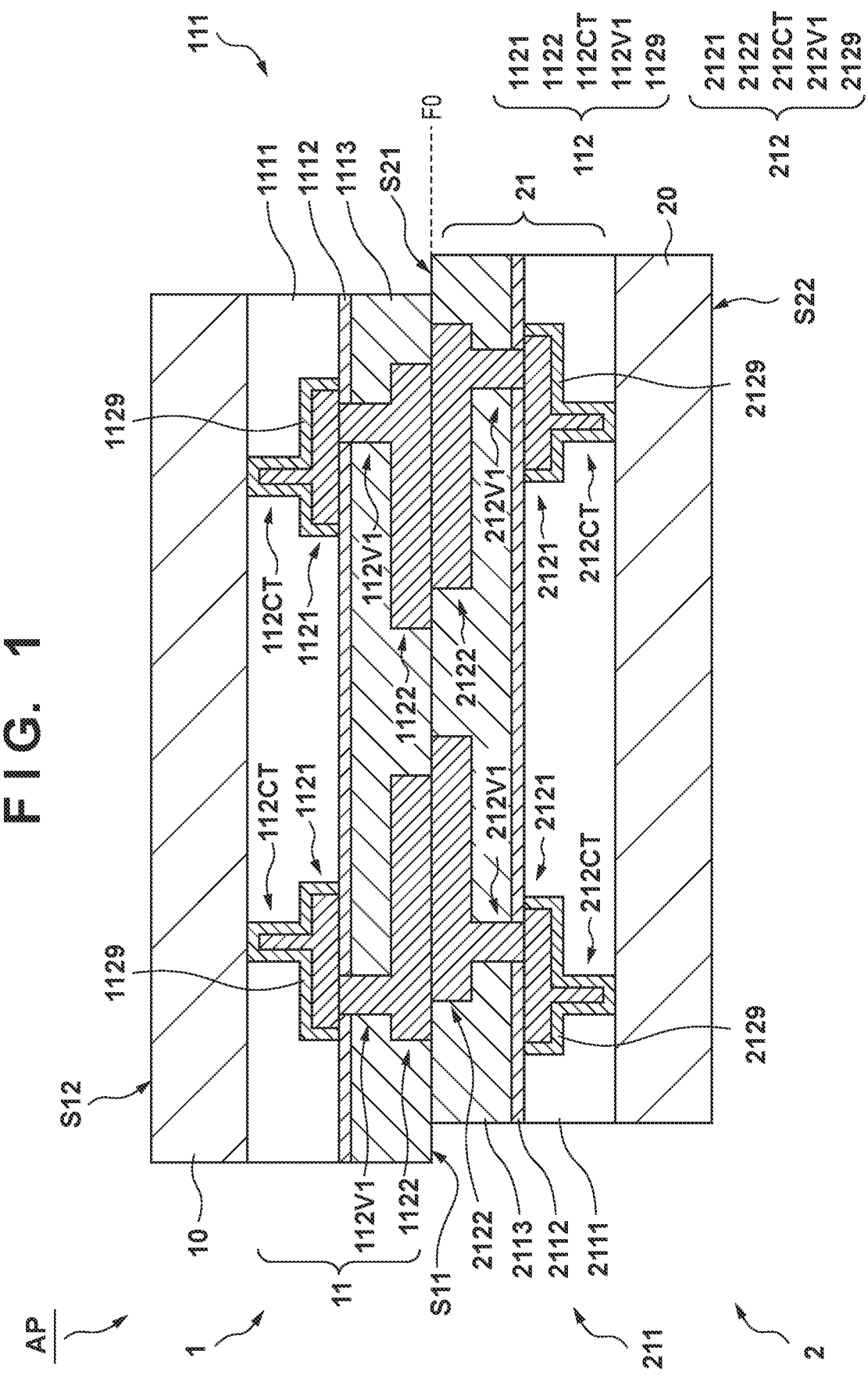
FIG. 1 is a schematic diagram for describing an example of a structure of a semiconductor device formed by two circuit components being bonded.

FIG. 1 is a schematic diagram illustrating an example of the configuration of a semiconductor device AP according to the embodiment. The semiconductor device AP includes a circuit component (first circuit component) 1 and a circuit component (second circuit component) 2 bonded to each other. The circuit component 1 includes a semiconductor substrate (first semiconductor substrate) 10 and a wiring structure (first wiring structure) 11 provided on the semiconductor substrate 10. Also, the circuit component 2 includes a semiconductor substrate (second semiconductor substrate) 20 and a wiring structure (second wiring structure) 21 provided on the semiconductor substrate 20.

First, the configuration of the circuit component 1 will be described. Although a silicon substrate is used as the semiconductor substrate 10 in the present embodiment, a substrate made of another semiconductor material such as gallium arsenide may be used in another embodiment. Although not illustrated here, the semiconductor substrate 10 is provided with one or more elements for realizing a predetermined circuit, for example, known passive elements and/or active elements such as a resistive element, a capacitive element, and a switching element (for example, a MOS transistor).

In the following description, the surface on which each element is formed with respect to the semiconductor substrate 10 is described as an upper surface, but expressions such as upper (higher than) and lower (lower than) merely describe the relative positional relationship between the two elements. This also applies to the semiconductor substrate 20 described later.

The wiring structure 11 is formed by stacking a plurality of insulating layers 111 and a plurality of wiring layers 112 on a semiconductor substrate 10. In the present embodiment, the plurality of insulating layers 111 includes insulating layers 1111 to 1113. Silicon oxide ($SiO_2$) is used for the insulating layer 1111, and silicon carbide (SiC) is used for the insulating layer 1112. In addition, although details will be described later, an insulating material having a base (base material) of silicon oxide and a composition satisfying a predetermined condition is used for the insulating layer 1113.

The plurality of wiring layers 112 includes a wiring layer (first wiring layer) 1121 and a wiring layer (second wiring layer) 1122. In the wiring structure 11, as a part of the plurality of wiring layers 112, a contact plug 112CT for electrically connecting the semiconductor substrate 10 (an element on the substrate 10) and the wiring layer 1121 is provided, and a via 112V1 for electrically connecting the wiring layer 1121 and the wiring layer 1122 is provided. In the present embodiment, both the wiring layer 1121 and the contact plug 112CT are covered with a barrier metal 1129, and are formed by a dual damascene method. Meanwhile, both the wiring layer 1122 and the via 112V1 are formed by a dual damascene method without being covered with a barrier metal 1129.

In the case of the dual damascene method, the wiring layer 1121 and the contact plug 112CT are integrally formed, and the wiring layer 1122 and the via 112V1 are integrally formed; however, description will be given separately for each part. The wiring layers 1121 and 1122 correspond to portions patterned in a shape extending in a direction parallel to the upper surface of the semiconductor substrate 10, and the contact plugs 112CT and the vias 112V1 correspond to columnar portions extending in a direction perpendicular to the upper surface of the semiconductor substrate 10. For example, copper (Cu), aluminum (Al), or the like may be used for the wiring layers 1121 and 1122, the contact plug 112CT, and the via 112V1, and tantalum (Ta), titanium (Ti), or the like may be used for the barrier metal 1129. In another embodiment, the wiring layers 1121 and 1122, the contact plug 112CT, and the via 112V1 may be formed by a damascene (single damascene) method.

For example, the wiring layer 1121 and the contact plug 112CT are surrounded by the insulating layer 1111, and the insulating layer 1112 is provided over the insulating layer 1111. Above that, the wiring layer 1122 and the via 112V1 are surrounded by the insulating layers 1112 and 1113 and electrically connected to the wiring layer 1121. In the present embodiment, the insulating layer 1112 is made of silicon carbide as described above, and functions as a diffusion prevention film for preventing metal diffusion from the wiring layer 1121 to the insulating layer 1113.

Next, the configuration of the circuit component 2 will be described. Here, it is assumed that the circuit component 2 has a similar configuration to the circuit component 1. For example, the wiring structure 21 is formed by stacking a plurality of insulating layers 211 and a plurality of wiring layers 212 on a semiconductor substrate 20. The plurality of insulating layers 211 includes insulating layers 2111 to 2113. The plurality of wiring layers 212 include a wiring layer (first wiring layer) 2121 and a wiring layer (second wiring layer) 2122, a contact plug 212CT, and a via 212V1.

The above description of each element of the circuit component 1 applies to the description of each component of the circuit component 2. That is, the description of the elements 20, 21, 211, 212, etc. of the circuit component 2 is similar to the description of the elements 10, 11, 111, 112, etc. of the circuit component 1. Here, the wiring structures 11 and 21 are given similar configurations for the sake of simplification of the description, but in other embodiments, the number of insulating layers and wiring layers may be different between the wiring structures 11 and 21, or other materials may be used for some of the insulating layers and/or wiring layers.

In the circuit component 1 described above, the exposed surface on the wiring structure 11 side is a surface S11, and the surface on the opposite side is a surface S12, and in the circuit component 2 described above, the exposed surface on the wiring structure 21 side is a surface S21, and the surface on the opposite side is a surface S22. The semiconductor device AP is formed by adhering the two circuit components 1 and 2 to each other by bonding at the upper surfaces S11 and S21 (a broken line in the figure indicates a bonding plane F0). That is, the wiring structures 11 and 12 are electrically connected in surface contact with each other at the uppermost insulating layers 1113 and 2113 and the uppermost wiring layers 1122 and 2122.

Here, the bonding between the circuit components 1 and 2 is realized, for example, by performing heat treatment after the surfaces S11 and S21 on which a predetermined surface treatment has been performed are adhered to each other, and the bonding strength thereof substantially accords to the strength of the bond between the insulating layers 1113 and 2113 forming the bonding plane F0. For example, the insulating layers 1113 and 2113 can be relatively strongly bonded by appropriately realizing a bond between silicon atoms and oxygen atoms at their bonding surfaces (O—Si—O bond). Meanwhile, it is also conceivable to use silicon oxide ($SiO_2$) for the insulating layers 1113 and 2113 in order to realize the above-described bonding between silicon atoms and oxygen atoms. However, according to this configuration, metal diffusion from the wiring layer 1122 to the insulating layer 2113 and/or metal diffusion from the wiring layer 2122 to the insulating layer 1113 may occur. This can also cause a decrease in the reliability of the device AP such as, for example, an unanticipated electrical short-circuit between the circuit components 1 and 2.

Therefore, there is a need for the insulating layers 1113 and 2113 to have both a bonding function for increasing the strength of the bond therebetween and a diffusion prevention function for preventing the above-mentioned metal diffusion. In this embodiment, the insulating layers 1113 and 2113 are both based on silicon oxide and partially comprise silicon carbide and/or silicon nitride. Here, "based on" means that they are at least majority silicon oxide. That is, the insulating layers 1113 and 2113 are formed so that the number of molecules of silicon oxide ($SiO_2$) is larger than the sum of the number of molecules of silicon carbide (SiC) and one third of the number of molecules of silicon nitride ($Si_3N_4$). When the numbers of oxygen atoms, carbon atoms, and nitrogen atoms in both the insulating layers 1113 and 2113 are $N_O$, $N_C$, and $N_N$, respectively, this can be expressed as $$6 \times N_O > 3 \times N_C + 4 \times N_N \qquad \text{(Equation 1)}$$

This (Equation 1) can also be said to indicate a percentage of $3SiO_2$ that can be replaced by 3SiC or $Si_3N_4$.

Insulating layers 1113 and 2113 may include silicon carbide and/or silicon nitride in part, i.e., it is sufficient that any one of $N_C > 0$ and $N_N > 0$, $N_C > 0$ and $N_N \geq 0$, and $N_C \geq 0$ and $N_N > 0$ be satisfied. In the present embodiment, the insulating layers 1113 and 2113 include both silicon carbide and silicon nitride ($N_C > 0$ and $N_N > 0$ is satisfied).

The insulating layer 1113 and/or the insulating layer 2113 may further contain other atoms within a range that does not deviate from the purpose of the above-described Equation 1. For example, the insulating layer 1113 may further include hydrogen atoms. Hydrogen atoms may be bonded to silicon atoms, for example, so as to terminate a dangling bond, but need not be (they may simply be present in a crystal structure). The insulating layer 1113 may further partially contain another silicon compound.

That is, the uppermost insulating layers 1113 and 2113 in the wiring structures 11 and 12 may be formed so that oxygen atoms, carbon atoms, and/or nitrogen atoms are bonded to silicon atoms and the above-described Equation 1 is satisfied. When the above-described Equation 1 holds, since the number of oxygen atoms is relatively large, the bonding (O—Si—O bonding) between silicon atoms and oxygen atoms at the bonding surface of the insulating layers 1113 and 2113 can be appropriately realized, and the insulating layers 1113 and 2113 can be strongly bonded. Since it is sufficient that the bonding strength between the insulating layers 1113 and 2113 is increased, the above Equation 1 may be satisfied in at least in the region in the bonding plane F0, and preferably also from the bonding plane F0 to a predetermined depth. In addition, since carbon atoms and/or nitrogen atoms are bonded to silicon atoms to form silicon carbide and/or silicon nitride, the above-mentioned metal diffusion from the wiring layers 1122 and/or 2122 can also be prevented. Therefore, according to the present embodiment, both a bonding function and a diffusion prevention function of the insulating layers 1113 and 2113 can be appropriately realized.

Here, the electrodes of the wiring layers 1122 and/or 2122 may be provided at a relatively large size so that the electrical connection between the wiring structures 11 and 21 is appropriately realized when the circuit components 1 and 2 are adhered and bonded together. The size can be determined based on, for example, an allowable amount of positional deviation when the circuit components 1 and 2 are adhered to each other. According to the bonding embodiment illustrated in FIG. 1, the circuit components 1 and 2 are bonded to each other at a position relatively shifted in the planar direction of the bonding plane F0. In this example, since electrodes of a relatively large size are provided in both of the wiring layers 1122 and 2122, the electrical connection between the wiring structures 11 and 21 is suitably realized. On the other hand, in this case, the electrode of the wiring layer 1122 is in contact with the insulating layer 2113, and the electrode of the wiring layer 2122 is in contact with the insulating layer 1113, but metal diffusion associated therewith can be prevented by the insulating layers 1113 and 2113 being formed so as to satisfy the above-described Equation 1. It is similar in a case where an electrode having a relatively large size is provided only in one of the wiring layers 1122 and 2122.

The conditions for the above-mentioned metal diffusion may also relate to metal materials constituting the wiring layers 1122 and 2122. Therefore, the insulating layers 1113 and 2113 may be configured to have a carbon atom concentration and/or a nitrogen atom concentration capable of realizing a diffusion prevention function corresponding to the metal material. For example, a lower limit for the concentration of carbon atoms and/or nitrogen atoms may be provided in both the insulating layers 1113 and 2113.

For example, a lower limit for the carbon atom concentration may be set in the range of $4.4 \times 10^{19}$ to $6.5 \times 10^{20}$ [atoms/$cm^3$], and, as an example, insulating layers 1113 and 2113 may be configured to have a nitrogen atom concentration of $6.5 \times 10^{20}$ [atoms/$cm^3$] or greater. Similarly, a lower limit for nitrogen atom concentration may be set in the range of $4.4 \times 10^{19}$ to $6.5 \times 10^{20}$ [atoms/$cm^3$]. In this embodiment, insulating layers 1113 and 2113 are configured such that the concentrations of both carbon atoms and nitrogen atoms are $6.5 \times 10^{20}$ [atoms/$cm^3$] or greater.

Alternatively, configuration may be such that the insulating layers 1113 and 2113 are formed on the basis of the results of actual measurements on prototypes manufactured by the inventor, so as to further satisfy, for example, $$N_C + N_N > 3.1 [\text{atoms \%}] \qquad \text{(Equation 2)}.$$

[Example of a Method for Forming the Insulating Layers]

Figure 2:
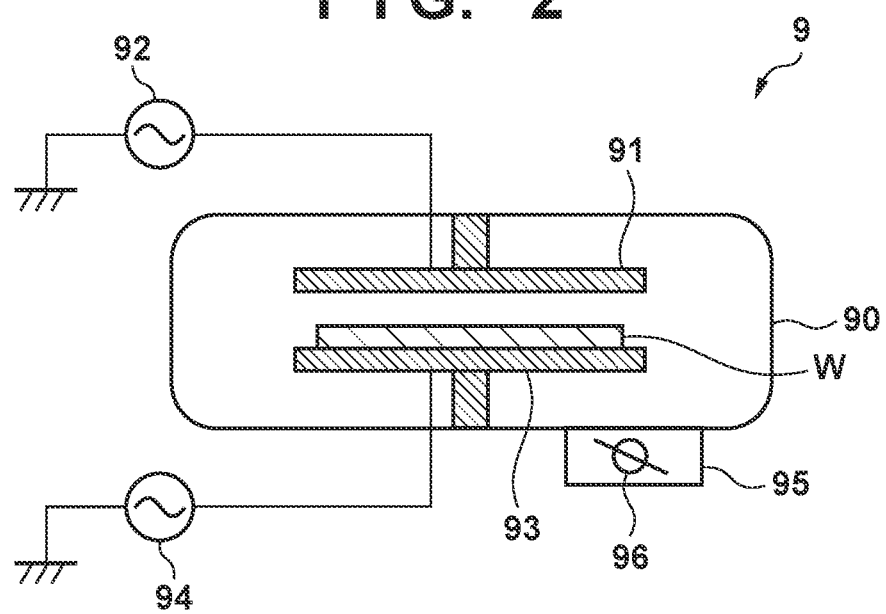
FIG. 2 is a schematic diagram for describing an example of a configuration of a plasma CVD device used when manufacturing the semiconductor device.

The insulating layer of a composition satisfying the above-described Equation 1 can be formed using a known semiconductor manufacturing process, that is, using a known semiconductor manufacturing device. FIG. 2 illustrates a configuration example of a plasma CVD (Chemical Vapor Deposition) device 9 as an example of a device for forming such insulating layers.

The plasma CVD device 9 includes a chamber 90, an upper electrode 91, an upper power supply 92, a lower electrode 93, a lower power supply 94, an exhaust mechanism 95, and a pressure regulating valve 96. The chamber 90 is a processing chamber for performing plasma CVD on a wafer W to be processed. The upper electrode 91 is disposed on the upper side within the chamber 90, and functions as a gas nozzle for supplying a source gas for plasma CVD. When performing plasma CVD, the upper power supply 92 applies an AC voltage of, for example, about 13.56 MHz to the upper electrode 91. The lower electrode 93 is disposed on the lower side within the chamber 90 so that the wafer W can be placed thereon, and functions as a heater for generating heat necessary for performing plasma CVD. When performing plasma CVD, the lower power supply 94 applies an AC voltage of, for example, about 400 kHz to the lower electrode 93. The exhaust mechanism 95 is configured so as to be able to discharge gas in the chamber 90. The pressure regulating valve 96 regulates the pressure in the chamber 90 and maintains the pressure in the chamber 90 at, for example, around 3 Torr when performing plasma CVD.

As the source gas, trimethoxysilane (TMS) and nitrous oxide ($N_2O$) are used, and by performing plasma CVD using such a plasma CVD device 9, an insulating layer composed of an insulating material having a composition satisfying the above-described Equation 1 can be formed.

Here, an embodiment in which an insulating layer having a composition satisfying the above-described Equation 1 is formed by plasma CVD is exemplified; however, the method for forming an insulating layer having that composition is not limited to the above example. For example, an ALD (Atomic Layer Deposition) method may be employed as another method for forming an insulating layer having the above-described composition.

As still another method, a silicon oxide film may be first formed by a known deposition method, and then carbon atoms and/or nitrogen atoms may be introduced into the silicon oxide film by, for example, ion implantation or plasma treatment, and these may be bonded to silicon atoms. For example, it is possible to perform plasma treatment using carbon gas and/or nitrogen gas on a silicon oxide film formed by a CVD method or the like, to thereby form an insulating layer having the above composition.

Whether or not the composition of the insulating layer satisfies the above-described Equation 1 can be determined by, for example, Auger electron spectroscopy (AES).

[Other Examples of Wiring Structures]

The number of insulating layers 111 and/or 211 is not limited to that illustrated in FIG. 1. For example, when the number of insulating layers 111 is 1, the insulating layer 111 becomes the uppermost insulating layer, and therefore, an insulating material having a composition satisfying the above-described Equation 1 may be used for the insulating layer 111. Therefore, it can be said that the number of the insulating layer 111 and/or 211 may be 1 or more (it is similar for the number of the wiring layer 112 and/or 212). Further, layers that are illustrated as a single layer in this specification may be formed by performing a predetermined deposition process two times or more, and for example, a layer of silicon oxide may be formed by stacking two or more silicon oxide films.

FIG. 3A is a schematic diagram illustrating an example of the configuration of a semiconductor device AP according to another embodiment. In the example of FIG. 3A, the plurality of insulating layers 111 includes insulating layers 1111 to 1114. Silicon oxide is used for the insulating layer 1111, silicon carbide is used for the insulating layer 1112, and silicon oxide is used for the insulating layer 1113. For the uppermost insulating layer 1114, an insulating material having a composition satisfying the above-described Equation 1 is used. Also, for the plurality of wiring layers 112, both the wiring layer 1122 and the via 112V1 are covered with a barrier metal 1129, and are formed by a dual damascene method.

The plurality of insulating layers 211 and the plurality of wiring layers 212 have the similar configurations to the plurality of insulating layers 111 and the plurality of wiring layers 112, respectively. That is, silicon oxide is used for the insulating layers 2111 and 2113, silicon carbide is used for the insulating layer 2112, and an insulating material having a composition satisfying the above-described Equation 1 is used for the uppermost insulating layer 2114. Also, both the wiring layer 2122 and the via 212V1 are covered with a barrier metal 2129 and formed by a dual damascene method.

As described above, both a bonding function and a diffusion prevention function can be appropriately realized by using an insulating material having a composition satisfying Equation 1. Therefore, in the example of FIG. 3A, when the circuit components 1 and 2 are adhered, they can be firmly bonded. At the same time, metal diffusion when the electrode of the wiring layer 1122 is in contact with the insulating layer 2114 can be appropriately prevented, and metal diffusion when the electrode of the wiring layer 2122 is in contact with the insulating layer 1114 can be appropriately prevented.

In the structure of FIG. 3A, the insulating layers 1114 and 2114 may be provided only on the bonding surface portion forming the bonding plane F0. For example, in relation to the uppermost wiring layer 1122 in the insulating layer 1114, the wiring layer 1122 is covered with the barrier metal 1129, and the lower surface of the insulating layer 1114 is located above the lower surface of the wiring layer 1122. Similarly, in relation to the uppermost wiring layer 2122 in the insulating layer 2114, the wiring layer 2122 is covered with the barrier metal 2129, and the lower surface of the insulating layer 2114 is located higher than the lower surface of the wiring layer 2122.

Figure 3B:
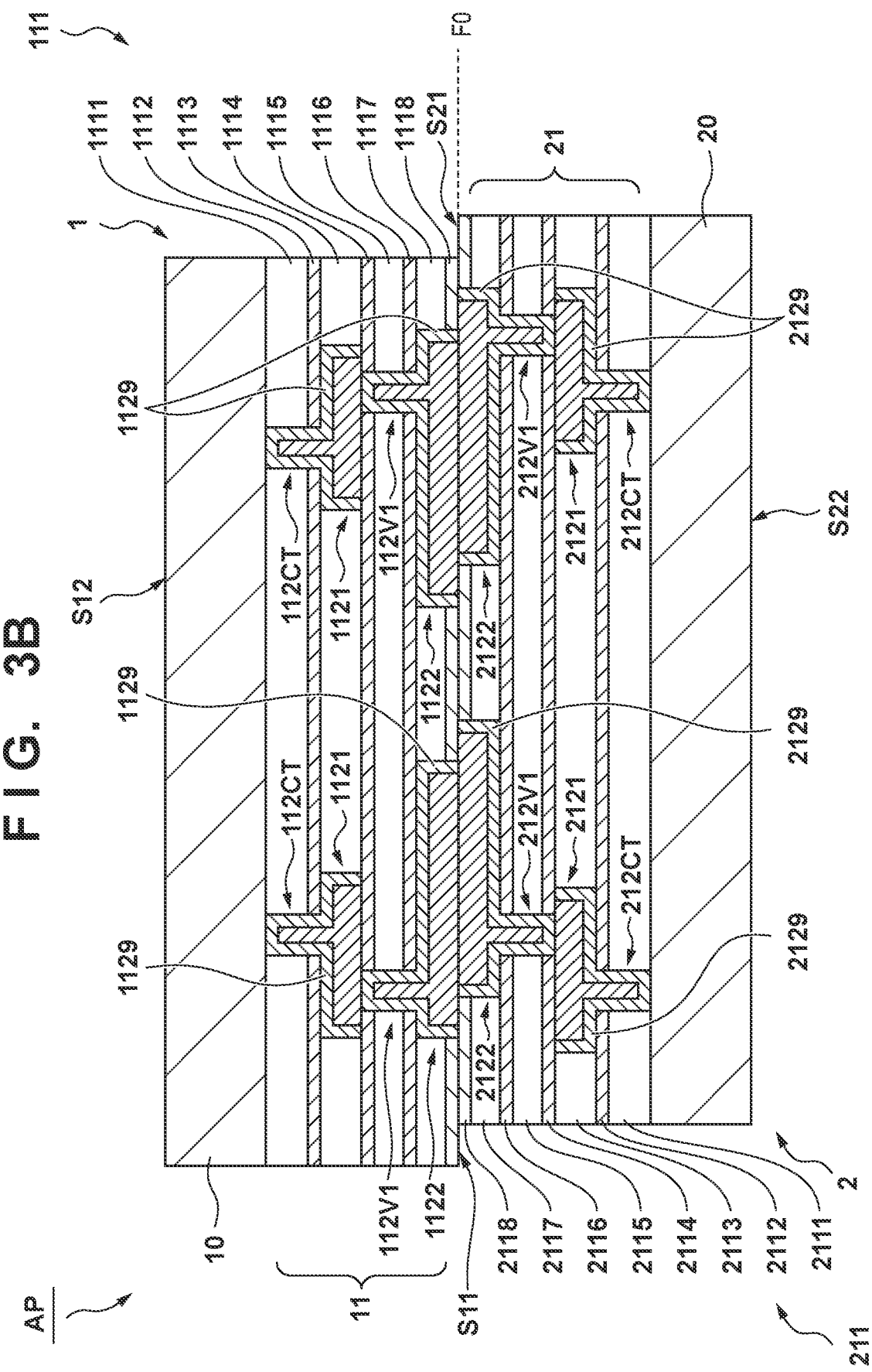
FIG. 3B is a schematic diagram for describing another example of a structure of the semiconductor device.

FIG. 3B is a schematic diagram illustrating an example of the configuration of a semiconductor device AP according to still another embodiment. In the example of FIG. 3B, the plurality of insulating layers 111 includes insulating layers 1111 to 1118. Silicon oxide is used for the insulating layers 1111, 1113, 1115, and 1117, and silicon carbide is used for the insulating layers 1112, 1114, and 1116. Also, for the uppermost insulating layer 1118, an insulating material having a composition satisfying the above-described Equation 1 is used. Other configurations are similar to the example of FIG. 3A.

The plurality of insulating layers 211 have a similar structure to the plurality of insulating layers 111. Specifically, silicon oxide is used for the insulating layers 2111, 2113, 2115, and 2117, and silicon carbide is used for the insulating layers 2112, 2114, and 2116. Also, for the uppermost insulating layer 2118, an insulating material having a composition satisfying the above-described Equation 1 is used. Other configurations are similar to the example of FIG. 3A.

As described above, both a bonding function and a diffusion prevention function can be appropriately realized by using an insulating material having a composition satisfying Equation 1. Therefore, in the example of FIG. 3B as well, when the circuit components 1 and 2 are adhered, they can be firmly bonded. At the same time, metal diffusion when the electrode of the wiring layer 1122 is in contact with the insulating layer 2118 can be appropriately prevented, and metal diffusion when the electrode of the wiring layer 2122 is in contact with the insulating layer 1118 can be appropriately prevented.

In the configuration of FIG. 3B, the insulating layers 1112 and 2112 function as etching stoppers in the etching process when forming grooves for providing the interconnect layers 1121 and 2121, respectively. Also, the insulating layers 1116 and 2116 function as etching stoppers in the etching process when forming grooves for providing the interconnect layers 1122 and 2122, respectively. Therefore, the structure of FIG. 3B can be considered to be more advantageous from a manufacturing perspective.

For example, in the wiring structure 11, when the wiring layer 1122 has a thickness of about 630 μm, the insulating layer 1118 may be provided with a thickness of about 400 μm (400 μm±40 μm), and the insulating layer 1117 may be provided with a thickness of about 400 μm (400 μm±40 μm). The insulating layers 2117 and 2118 and the wiring layer 2122 in the wiring structure 21 are similar to the insulating layers 1117 and 1118 and the wiring layer 1122, respectively.

FIG. 4 is a schematic diagram illustrating an example of the configuration of a semiconductor device AP according to still another embodiment. In the example of FIG. 4, the plurality of insulating layers 111 include insulating layers 1111 to 1112, and an insulating material having a composition satisfying the above-described Equation 1 can be used for both the insulating layers 1111 to 1112. Similarly, the plurality of insulating layers 211 include insulating layers 2111 to 2112, and an insulating material having a similar composition can be used for both the insulating layers 2111 to 2112.

As described above, both a bonding function and a diffusion prevention function can be appropriately realized by using an insulating material having a composition satisfying Equation 1. Therefore, in the example of FIG. 4, the wiring layers 1121, 1122, 2121, and 2122, the contact plugs 112CT and 212CT, and the vias 112V1 and 212V1 need not be covered with a barrier metal.

It is similar for the insulating layers 1113 and 2113 in the configuration of FIG. 1, but in the configuration of FIG. 4, the insulating layers 1112 and 2112 are provided so as to be relatively thick (up to a position relatively distanced from the bonding plane F0). For example, regarding the insulating layer 1112, in relation to the uppermost wiring layer 1122, the wiring layer 1122 is not covered with the barrier metal 1129, and the lower surface of the insulating layer 1112 is located lower than the lower surface of the wiring layer 1122. Similarly, in relation to the uppermost wiring layer 2122 in the insulating layer 2112, the wiring layer 2122 is covered with the barrier metal 2129, and the lower surface of the insulating layer 2112 is located lower the lower surface of the wiring layer 2122.

In the example of FIG. 4, in the plurality of insulating layers 111, the insulating layer 1111 is configured to have a similar composition to that of the uppermost insulating layer 1112. Also, in the plurality of insulating layers 211, the insulating layer 2111 is configured to have a similar composition to that of the uppermost insulating layer 2112. According to the example of FIG. 4, since it is possible to unify the manufacturing method of the individual insulating layers, it can be said that the semiconductor device AP can be manufactured relatively easily or at a relatively low cost.

In short, the circuit components 1 and 2 are bonded by the wiring structures 11 and 12 being in surface contact and electrically connected to each other at their uppermost wiring layer and uppermost insulating layer. At this time, both of the bonding function and the diffusion prevention function are appropriately realized by making each of the uppermost insulating layers be made of an insulating material having a composition satisfying the above-described Equation 1. As a result, the circuit components 1 and 2 are firmly bonded together, and at the same time, metal diffusion that may occur after the bonding and a resulting decrease in reliability of the semiconductor device AP are appropriately prevented.

In order to reduce parasitic capacitance that may occur between elements on the semiconductor substrate 10 or parasitic capacitance formed in the wiring layer 112 described below, configuration may be such that most of the plurality of insulating layers 111 and 211 are formed of a material having a lower dielectric constant than that of the uppermost insulating layer. For example, in the example of FIG. 3A, a mode in which silicon oxide is used for the insulating layers 1111, 1113, 2111, and 2113 is described, but the dielectric constant of silicon oxide is about 3.8 to 4.1 depending on the compositional mode. For silicon oxide, there are cases where the dielectric constant becomes about 4.3 when silicon carbide (carbon atom) and/or silicon nitride (nitrogen atom) is contained. Therefore, most of the plurality of insulating layers 111 and 211 may be made of a material having a dielectric constant of 4.5 or less, preferably a dielectric constant of 4.3 or less, more preferably a dielectric constant of 4.1 or less, and still more preferably a dielectric constant of 4.0 or less, for example. In order to further reduce the above-mentioned parasitic capacitance, the silicon oxide may have a porous structure (a so-called porous $SiO_2$ film).

Meanwhile, in the example of FIG. 4, an embodiment in which an insulating material having a composition satisfying the above-described Equation 1 is used for the insulating layers 1111, 1112, 2111, and 2112. In this case, although manufacturing costs for the circuit components 1 and 2 can be reduced, generally the dielectric constant of the insulating layer having the above composition may be higher than that of silicon oxide. Therefore, it can be said that the configuration example of FIG. 4 may be suitably employed when a degree of circuit integration is relatively low (for example, when the pitch of the wiring pattern is relatively large).

EMBODIMENTS

Hereinafter, a configuration of a solid-state imaging device AP' including a plurality of pixels will be described as an example of the semiconductor device AP with reference to FIG. 5. The solid-state imaging device AP' is configured to be able to detect light incident on a plurality of pixels and output an electric signal corresponding to the light as a pixel signal. It should be noted that the above-mentioned content (refer to FIGS. 1-4C) is invoked for the content omitted in the following descriptions.

In this example, some of the plurality of elements forming each of the plurality of pixels are provided in the circuit component 1, and the rest are provided in the circuit component 2. For example, the semiconductor substrate 10 is provided with a photoelectric conversion element 101, a floating diffusion 102, and a transfer transistor (a first transistor) 103. The photoelectric conversion element 101 is a photodiode formed by a PN junction, and generates charge corresponding to the amount of incident light by photoelectric conversion. The floating diffusion 102 is a capacitance component formed by a PN junction. The transfer transistor 103 is a MOS transistor, and transfers the electric charge of the photoelectric conversion element 101 to the floating diffusion 102.

The photoelectric conversion element 101 and the floating diffusion 102 are formed by, for example, providing an N-type impurity region in a P-type well of the semiconductor substrate 10. The transfer transistor 103 is an N-channel MOS transistor. Note that the polarities of these elements may be interchanged as necessary, and for example, these elements may be configured by reversing the N-type/P-type conductivity types.

The semiconductor substrate 20 is provided with an amplification transistor (second transistor) 104. The amplification transistor 104 is a MOS transistor, and here, for example, an N-channel MOS transistor is used. Although not illustrated here, another transistor (e.g., a transistor that determines whether or not to output a signal from the amplification transistor 104) may be further provided on the semiconductor substrate 20.

In the wiring structure 11, the plurality of insulating layers 111 includes insulating layers 1111 to 1117. The plurality of wiring layers 112 includes wiring layers 1121 and 1122, a contact plug 112CT, and a via 112V1. Silicon oxide is used for the insulating layers 1111, 1112, 1114, and 1116. Silicon carbide is used for the insulating layers 1113 and 1115. Also, for the uppermost insulating layer 1117, a wiring structure 11 having an insulating material of a composition satisfying the above-described Equation 1 is used.

In this example, the contact plug 112CT is surrounded by the insulating layer 1111, on which the wiring layer 1121 is covered by the barrier metal 1129 and surrounded by the insulating layer 1112. The insulating layer 1113 functions as a diffusion prevention film for preventing metal diffusion from the wiring layer 1121. Furthermore, the wiring layer 1122 and the via 112V1 are covered with the barrier metal 1129 and surrounded by the insulating layers 1113 to 1117. The insulating layer 1115 functions as an etching stopper in the etching process when forming grooves for providing the interconnect layer 1122. The composition of the insulating layer 1117 satisfies the above-described Equation 1, so that both the bonding function and the diffusion prevention function can be realized.

In the wiring structure 21, the plurality of insulating layers 211 includes insulating layers 2111 to 211B. The plurality of wiring layers 212 includes wiring layers 2121, 2122, and 2123, a contact plug 212CT, and vias 212V1 and 212V2. The via 212V2 electrically connects the wiring layers 2122 and 2123. Silicon oxide is used for the insulating layers 2111, 2112, 2114, 2116, 2118, and 211A. Silicon carbide is used for the insulating layers 2113, 2115, 2117, and 2119. Also, for the uppermost insulating layer 211B, a wiring structure 21 having an insulating material of a composition satisfying the above-described Equation 1 is used.

In this example, the contact plug 212CT is surrounded by the insulating layer 2111, on which the wiring layer 2121 is covered by the barrier metal 2129 and surrounded by the insulating layer 2112. The insulating layer 2113 functions as a diffusion prevention film for preventing metal diffusion from the wiring layer 2121. Also, on top of that, the wiring layer 2122 and the via 212V1 are covered with the barrier metal 2129 and surrounded by the insulating layers 2113 to 2116. The insulating layer 2115 functions as an etching stopper in the etching process when forming grooves for providing the interconnect layer 2122. The insulating layer 2117 functions as a diffusion prevention film for preventing metal diffusion from the wiring layer 2122. Also, on top of that, the wiring layer 2123 and the via 212V2 are covered with the barrier metal 2129 and surrounded by the insulating layers 2117 to 211B. The insulating layer 2119 functions as an etching stopper in the etching process when forming grooves for providing the interconnect layer 2123. The composition of the insulating layer 211B satisfies the above-described Equation 1, so that both the bonding function and the diffusion prevention function can be realized.

The above-described wiring structures 11 and 21 are configured to electrically connect the floating diffusion 102 and the gate electrode of the amplification transistor 104. Thus, the photoelectric conversion element 101, the floating diffusion 102, the transfer transistor 103, and the amplification transistor 201 form a pixel circuit, and the amplification transistor 201 can output a signal corresponding to the voltage of the floating diffusion 102.

The semiconductor substrates 10 and 20 are provided with element isolation portions 109 and 209 for realizing electrical isolation between elements or pixels, respectively. Although STI (Shallow Trench Isolation) is illustrated in this example as the element isolation portions 109 and 209, other isolation configurations may be employed for the element isolation portions 109 and 209 as other embodiments.

On the lower surface side (the surface S12 side in FIG. 1, and the upper side in FIG. 5) of the semiconductor substrate 10, an optical system 15 is further provided. The optical system 15 includes an antireflection film 151, a planarization film 152, a color filter layer 153, and a microlens 154. The color filter layer 153 is provided so that light of a corresponding color can pass through each pixel so that, for example, a plurality of pixels form a pixel array of a Bayer array. The microlens 154 is provided corresponding to a respective pixel. The light incident on each pixel is condensed by the microlens 154, passes through the color filter layer 153, and enters the semiconductor substrate 10 (the light incident on the semiconductor substrate 10 is photoelectrically converted by the photoelectric conversion element 101 as described above).

In short, each pixel of the solid-state imaging device AP' includes a photoelectric conversion element 101, a floating diffusion 102, a transfer transistor 103, and an amplification transistor 201. The photoelectric conversion element 101, the floating diffusion 102, and the transfer transistor 103 are provided on the semiconductor substrate 10. The amplification transistor 201 is provided in the semiconductor substrate 20. The elements on the semiconductor substrate 10 and the elements on the semiconductor substrate 20 are appropriately electrically connected by the wiring structures 11 and 21, and thereby the amplification transistor 201 can output a signal corresponding to the voltage of the floating diffusion 102.

FIGS. 6A-7F are schematic diagrams illustrating aspects in respective steps of a method for manufacturing the solid-state imaging device AP'. The solid-state imaging device AP' can be manufactured using a known semiconductor manufacturing process, for example, a process using a lithography technique. As a summary, the circuit component 1 is manufactured in the process of FIGS. 6A-6B, and the circuit component 2 is manufactured in the process of FIGS. 6C-6D. Thereafter, after the circuit components 1 and 2 are adhered and bonded together in a process of FIG. 7A, the optical system 15 is formed by a process of FIG. 7B, and by such a procedure, the solid-state imaging device AP' is manufactured.

Figure 6A:
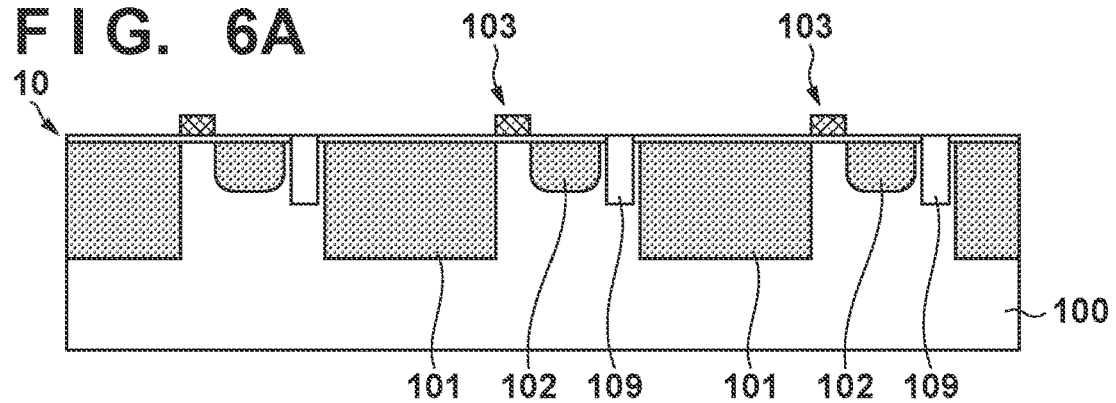
FIG. 6A is a schematic diagram for describing an example of a method of manufacturing a solid-state imaging device according to an embodiment.

A semiconductor substrate 10 is prepared by the process of FIG. 6A, and a photoelectric conversion element 101, a floating diffusion 102, a transfer transistor 103, and an element isolation portion 109 are formed in a region 100 of the semiconductor substrate 10 where pixels are to be formed. What is referred to as "prepared" in the present specification can be broadly construed, and the concept of preparation encompasses not only preparation but also acquisition by transfer or the like of a preparation made by another person.

Figure 6B:
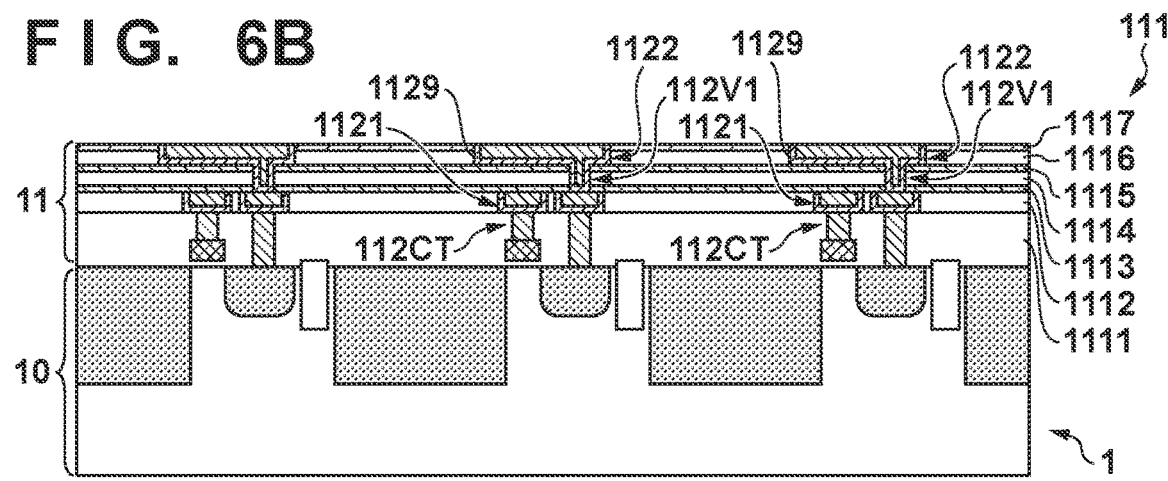
FIG. 6B is a schematic diagram for describing an example of a method of manufacturing a solid-state imaging device according to an embodiment.

In the process of FIG. 6B, the wiring structure 11 is formed on the semiconductor substrate 10 obtained by the process of FIG. 6A. This step is performed by repeating, for example, a step of forming a predetermined member (an insulating member or a metal member) using a known deposition method, a patterning step (a step of forming a resist pattern and etching using the resist pattern) using a lithography technique, and a washing step. The insulating layer 1117 can be formed by the plasma CVD described with reference to FIG. 2. The circuit component 1 is thus obtained.

Figure 6C:
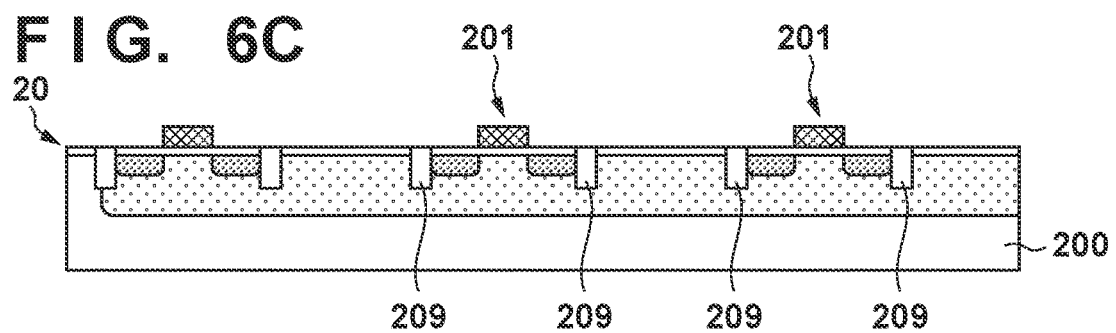
FIG. 6C is a schematic diagram for describing an example of a method of manufacturing a solid-state imaging device according to an embodiment.
Figure 6D:
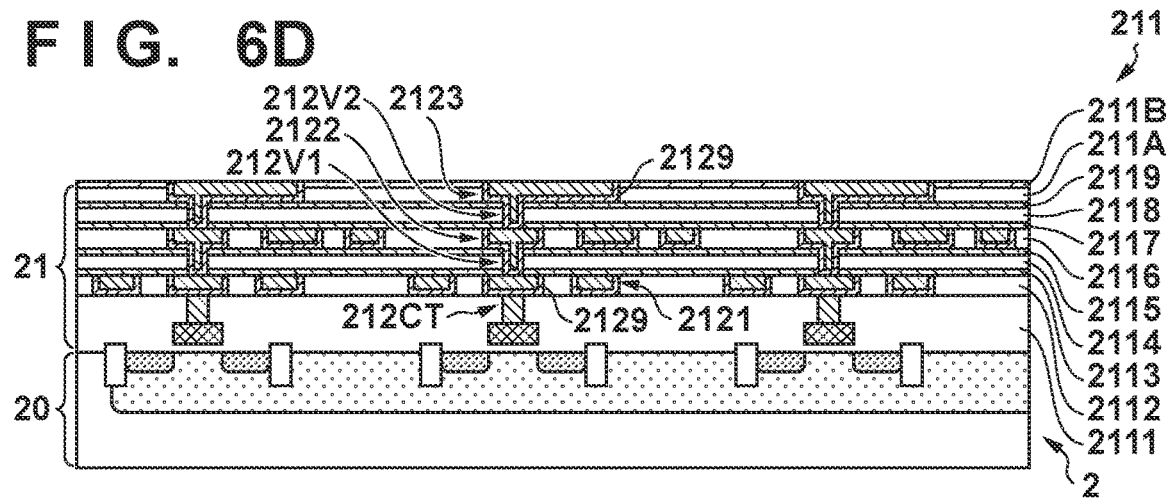
FIG. 6D is a schematic diagram for describing an example of a method of manufacturing a solid-state imaging device according to an embodiment.

In the process of FIG. 6C, the semiconductor substrate 20 is prepared, and the amplification transistor 201 and the element isolation portion 209 are respectively formed in a region 200 of the semiconductor substrate 20 where pixels are to be formed. In the process of FIG. 6D, the wiring structure 21 is formed on the semiconductor substrate 20 obtained in the process of FIG. 6C. The process of FIG. 6D is performed by a similar procedure to the process of FIG. 6B, and the insulating layer 211B can be formed by plasma CVD as described with reference to FIG. 2. The circuit component 2 is thus obtained.

Figure 7A:
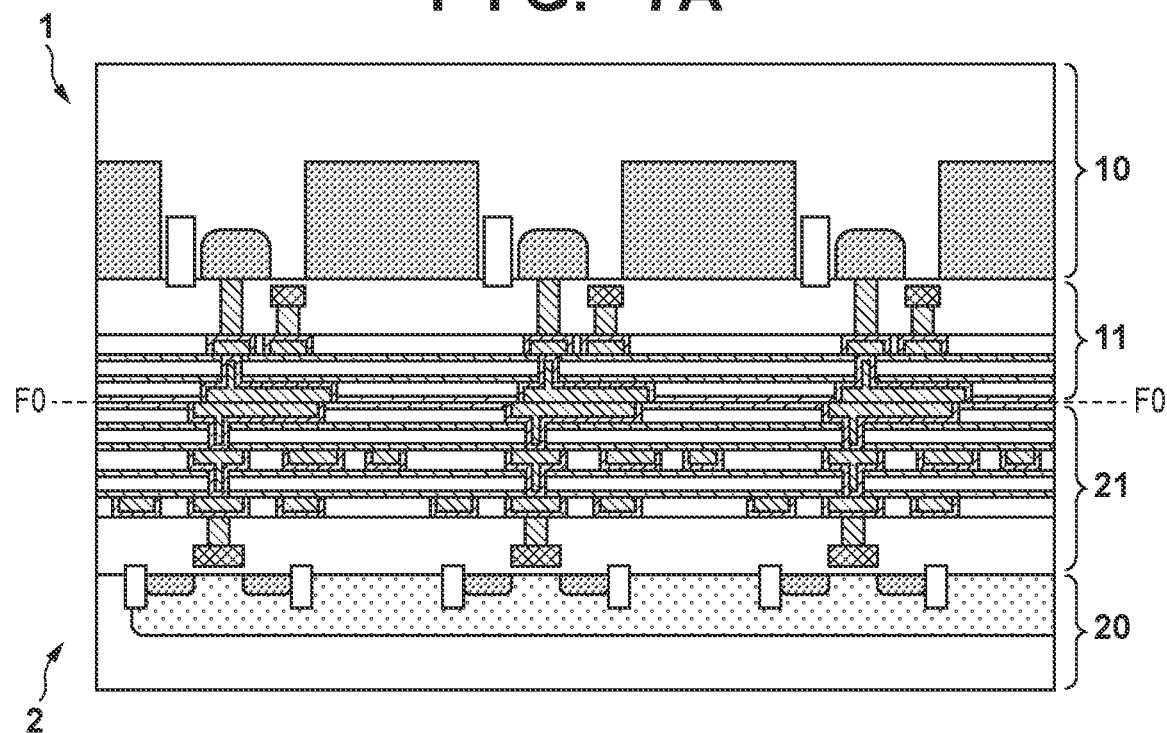
FIG. 7A is a schematic diagram for describing an example of a method of manufacturing a solid-state imaging device according to an embodiment.

In the process of FIG. 7A, the circuit component 1 obtained in the process of FIG. 6B and the circuit component 2 obtained in the process of FIG. 6D are adhered together, and the circuit components 1 and 2 are bonded by causing the surfaces of the wiring structures 11 and 21 to contact and be electrically connected. The bonding of the circuit components 1 and 2 can be realized, for example, by performing surface activation treatment using oxygen plasma on the bonding surfaces (the upper surfaces of the wiring structures 11 and 21), washing these with pure water, and then causing them to adhere at the bonding surfaces, and further performing heat treatment (about 350° C.). At this time, the wiring layers 1122 and 2123 thermally expand and connect to each other. Incidentally, by not providing unnecessary wiring patterns in the wiring layers 1122 and 2123, stresses that may occur at a bonded portion can be suppressed, and bonding between the wiring structures 11 and 21 can be more appropriately realized.

As described above, the composition of the insulating layer 1117 of the wiring structure 11 and the insulating layer 211B of the wiring structure 21, which form the above-mentioned bonding plane, satisfies the above-described Equation 1, and both a bonding function and a diffusion prevention function can be appropriately realized. Therefore, the above-mentioned strong bonding of the circuit components 1 and 2 is realized, and metal diffusion that may occur between the wiring structures 11 and 21 after the bonding is appropriately prevented.

Figure 7B:
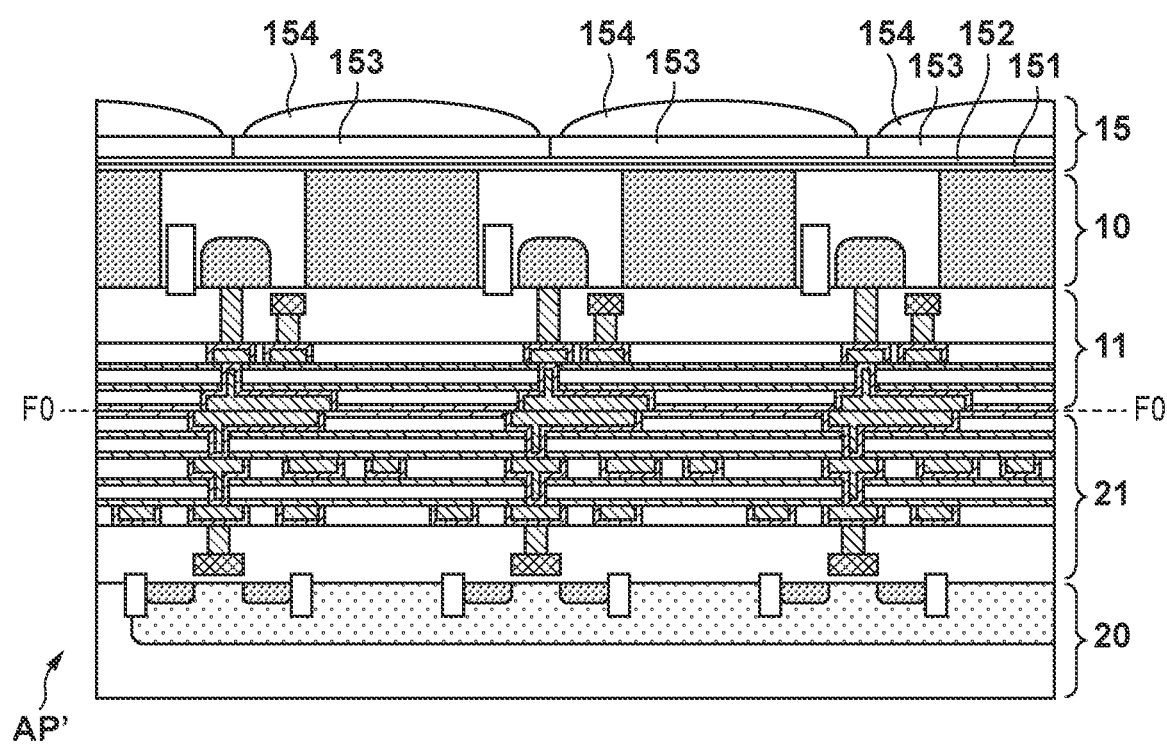
FIG. 7B is a schematic diagram for describing an example of a method of manufacturing a solid-state imaging device according to an embodiment.

In the process of FIG. 7B, in the structure obtained by the process of FIG. 7A, the semiconductor substrate 10 is thinned, and the optical system 15 is formed. The thinning of the semiconductor substrate 10 is performed by CMP (chemical mechanical polishing) or etching. Any of the elements 151 to 154 of the optical system 15 can be formed by a film forming method such as CVD or spin coating, a patterning method using exposure treatment, development treatment, etching, or the like, a molding method using heat treatment or the like, or other known semiconductor manufacturing processes.

Though not illustrated here, one or more through electrodes (Through-Silicon Via (TSVs)) extending vertically from the wiring structure 21 to the semiconductor substrate 10 may be provided in the solid-state imaging device AP' prior to the process in FIG. 7B. The through electrode is provided in an end region where the microlens 154 is not disposed. The semiconductor substrate 20 may be provided with a driving unit (vertical scanning circuit) for driving a plurality of pixels and a signal reading unit (horizontal scanning circuit) for reading out pixel signals from the driven pixels on a lower side or a peripheral part of the through electrode.

According to an intensive study by the inventors, the strength of the bond between the circuit components 1 and 2 is sufficiently ensured by the portion in which the above-described bonding (O—Si—O bonding) is realized being at least a majority in the bonding plane F0 (that is, by performing the process of FIG. 7A such that the above-described Equation 1 holds). Bonding strength is sufficiently high with respect to stress that may be generated at a bonded portion in the step of forming the through electrode described above.

The solid-state imaging device AP' thus manufactured is incorporated in a predetermined electronic device together with a processor. The solid-state imaging device AP' outputs a group of pixel signals read out from a plurality of pixels to the processor. The processor performs predetermined signal processing on the group of pixel signals to generate image data. Incidentally, the concept of an electronic device includes not only those having an imaging function as a main function (camera, etc.) but also those having an auxiliary imaging function (cellular phone, smart phone, etc.).

As described above, according to the present embodiment, the semiconductor device AP includes two circuit components 1 and 2. The circuit component 1 includes a semiconductor substrate 10 and a wiring structure 11 formed by stacking one or more wiring layers 112 and one or more insulating layers 111 thereon. The circuit component 2 includes a semiconductor substrate 20 and a wiring structure 21 formed by stacking one or more wiring layers 212 and one or more insulating layers 211 thereon. The circuit components 1 and 2 are bonded by the wiring structures 11 and 21 being in surface contact and electrically connected to each other at their uppermost wiring layer and uppermost insulating layer. In such a structure, the uppermost insulating layer is composed of oxygen atoms and carbon atoms and/or nitrogen atoms bonded to silicon atoms, and is composed of a composition satisfying the above-described Equation 1 at least at the bonding plane F0.

According to the present embodiment, bonds (O—Si—O bonds) between silicon atoms and the oxygen atoms at the bonding plane F0 between the wiring structures 11 and 21 are appropriately realized. Therefore, it is possible to improve the bonding strength thereof. In addition, at these bonded portions, carbon atoms and/or nitrogen atoms are bonded to silicon atoms to form silicon carbide and/or silicon nitride, thereby appropriately preventing metal diffusion that may occur between the wiring structures 11 and 21 after bonding. Therefore, according to the present embodiment, it is possible to improve the reliability of the semiconductor device AP.

Although some preferred embodiments have been described above, the present invention is not limited to these examples, and partial modifications or combinations may be made without departing from the spirit of the present invention. Also, it goes without saying that the particular terms recited in this specification are used for the purpose of describing the invention only, and that the invention is not limited to the strict meaning of the terms, and may include equivalents thereof. For example, a circuit component may be referred to as a circuit board.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-171676, filed Sep. 13, 2018, which is hereby incorporated by reference herein in its entirety.

What is claimed is:
1. A semiconductor device comprising a first circuit component and a second circuit component,
wherein the first circuit component has a first semiconductor substrate and a first wiring structure formed by stacking one or more wiring layers and one or more insulating layers on the first semiconductor substrate,
wherein the second circuit component has a second semiconductor substrate and a second wiring structure formed by stacking one or more wiring layers and one or more insulating layers on the second semiconductor substrate,
wherein the first wiring structure and the second wiring structure of the first circuit component and the second circuit component are bonded to each other, and wherein the insulating layers of the first wiring structure and the second wiring structure forming a bonding plane between the first circuit component and the second circuit component are both composed of silicon atoms, oxygen atoms, and at least one selected from the group consisting of carbon atoms and nitrogen atoms, and, letting numbers of oxygen atoms, carbon atoms, and nitrogen atoms in at least the insulating layers be $N_O$, $N_C$, and $N_N$, respectively, $6 \times N_O > 3 \times N_C + 4 \times N_N$ holds.

2. The semiconductor device according to claim 1, wherein in at least one of the first wiring structure and the second wiring structure, the insulating layers further include hydrogen atoms.

3. The semiconductor device according to claim 1, wherein in at least one of the first wiring structure and the second wiring structure, another insulating layer different from an uppermost insulating layer forming the bonding plane is formed of a material having a lower dielectric constant than that of the uppermost insulating layer.

4. The semiconductor device according to claim 3, wherein at least a portion of the another insulating layer is made of a material having a dielectric constant of 4.5 or less.

5. The semiconductor device according to claim 1, wherein in at least one of the first wiring structure and the second wiring structure, an uppermost wiring layer forming the bonding plane in a plurality of wiring layers is covered with a barrier metal, and a lower surface of an uppermost insulating layer forming the bonding plane in a plurality of insulating layers is positioned higher than a lower surface of the uppermost wiring layer.

6. The semiconductor device according to claim 1, wherein in at least one of the first wiring structure and the second wiring structure, an uppermost wiring layer forming the bonding plane in a plurality of wiring layers is covered with a barrier metal, and a lower surface of an uppermost insulating layer forming the bonding plane in a plurality of insulating layers is positioned lower than a lower surface of the uppermost wiring layer.

7. The semiconductor device according to claim 1, wherein in at least one of the first wiring structure and the second wiring structure, another insulating layer different from an uppermost insulating layer forming the bonding plane is configured by a composition similar to the uppermost insulating layer.

8. The semiconductor device according to claim 1, wherein the insulating layers forming the bonding plane include silicon oxide ($SiO_2$), silicon carbide (SiC), and silicon nitride ($Si_3N_4$).

9. The semiconductor device according to claim 1, wherein $N_C > 0$ and $N_N > 0$ is satisfied.

10. The semiconductor device according to claim 9, wherein the insulating layers forming the bonding plane are configured such that a concentration of both carbon atoms and nitrogen atoms is $6.5 \times 10^{20}$ [atoms/cm$^3$] or more.

11. The semiconductor device according to claim 1, wherein the semiconductor device is a solid-state imaging device including a plurality of pixels, and wherein each of the plurality of pixels includes:
a photoelectric conversion element;
a floating diffusion;
a first transistor configured to transfer a charge of the photoelectric conversion element to the floating diffusion; and
a second transistor configured to output a signal corresponding to a voltage of the floating diffusion,
wherein the photoelectric conversion element, the floating diffusion, and the first transistor are provided on the first semiconductor substrate, and
wherein the second transistor is provided on the second semiconductor substrate.

12. An electronic device, comprising:
the semiconductor device according to claim 1; and
a processor configured to process a signal from the semiconductor device.

13. A method for manufacturing a semiconductor device, the method comprising:
preparing a first circuit component having a first semiconductor substrate and a first wiring structure formed by stacking one or more wiring layers and one or more insulating layers on the first semiconductor substrate;
preparing a second circuit component having a second semiconductor substrate and a second wiring structure formed by stacking one or more wiring layers and one or more insulating layers on the second semiconductor substrate; and
bringing the first wiring structure and the second wiring structure into contact with each other to cause the first circuit component and the second circuit component to bond,
wherein in each of the preparing of the first circuit component and the preparing of the second circuit component, when the insulating layers of the first wiring structure and the second wiring structure forming a bonding plane between the first circuit component and the second circuit component are both composed of silicon atoms, oxygen atoms, and at least one selected form the group consisting of carbon atoms and nitrogen atoms, and, letting numbers of oxygen atoms, carbon atoms, and nitrogen atoms in at least the bonding plane be $N_O$, $N_C$, and $N_N$, respectively, $6 \times N_O > 3 \times N_C + 4 \times N_N$ holds.

14. The method according to claim 13, wherein in each of the preparing of the first circuit component and the preparing of the second circuit component, the insulating layer forming the bonding plane is formed by plasma CVD using trimethoxysilane and nitrous oxide.

* * * * *